United States Patent
Fossum

(10) Patent No.: US 7,095,440 B2
(45) Date of Patent: Aug. 22, 2006

(54) PHOTODIODE-TYPE PIXEL FOR GLOBAL ELECTRONIC SHUTTER AND REDUCED LAG

(75) Inventor: Eric R. Fossum, La Crescenta, CA (US)

(73) Assignee: Micron Technology, Inc., Boise, ID (US)

( * ) Notice: Subject to any disclaimer, the term of this patent is extended or adjusted under 35 U.S.C. 154(b) by 631 days.

(21) Appl. No.: 10/273,085

(22) Filed: Oct. 16, 2002

(65) Prior Publication Data

US 2003/0103153 A1    Jun. 5, 2003

Related U.S. Application Data

(63) Continuation of application No. 09/025,079, filed on Feb. 17, 1998, now Pat. No. 6,667,768.

(51) Int. Cl.
*H04N 3/14* (2006.01)
*H04N 5/335* (2006.01)

(52) U.S. Cl. ........................... 348/308; 348/314

(58) Field of Classification Search ............... 348/308, 348/309, 301, 302, 303, 313, 314, 362, 296, 348/297; 257/292, 291, 237, 239, 216; 250/208.1
See application file for complete search history.

(56) References Cited

U.S. PATENT DOCUMENTS

| | | | |
|---|---|---|---|
| 4,369,378 A * | 1/1983 | Rockett, Jr. ............. | 257/237 |
| 4,644,572 A * | 2/1987 | Lambeth .................. | 257/216 |
| 4,684,800 A * | 8/1987 | Morse et al. ............. | 257/237 |
| 4,686,648 A   | 8/1987 | Fossum | |
| 4,744,623 A   | 5/1988 | Prucnal et al. | |
| 4,776,925 A   | 10/1988 | Fossum et al. | |
| 4,839,735 A * | 6/1989 | Kyomasu et al. ......... | 348/297 |
| 4,920,069 A   | 4/1990 | Fossum et al. | |
| 5,054,040 A * | 10/1991 | Yariv et al. ............. | 257/237 |
| 5,055,900 A   | 10/1991 | Fossum et al. | |
| 5,080,214 A   | 1/1992 | Fossum | |
| 5,105,277 A * | 4/1992 | Hayes et al. ............ | 348/313 |
| 5,236,871 A   | 8/1993 | Fossum et al. | |
| 5,343,297 A * | 8/1994 | Tiemann et al. .......... | 348/306 |
| 5,386,128 A   | 1/1995 | Fossum et al. | |
| 5,471,515 A   | 11/1995 | Fossum et al. | |
| 5,493,423 A * | 2/1996 | Hosier .................... | 358/482 |
| 5,548,773 A   | 8/1996 | Kemeny et al. | |
| 5,665,959 A   | 9/1997 | Fossum et al. | |
| 5,793,322 A   | 8/1998 | Fossum et al. | |
| 5,841,126 A   | 11/1998 | Fossum et al. | |
| 5,872,371 A * | 2/1999 | Guidash et al. ......... | 257/292 |
| 5,880,691 A   | 3/1999 | Fossum et al. | |
| 5,886,659 A   | 3/1999 | Pain et al. | |
| 5,887,049 A   | 3/1999 | Fossum | |
| 5,909,026 A   | 6/1999 | Zhou et al. | |
| 5,920,345 A * | 7/1999 | Sauer .................... | 348/308 |
| 5,949,483 A   | 9/1999 | Fossum et al. | |

(Continued)

*Primary Examiner*—Aung Moe
(74) *Attorney, Agent, or Firm*—Dickstein Shapiro Morin & Oshinsky LLP

(57) ABSTRACT

Operation for global electronic shutter photodiode-type pixels. In a first mode of operation, lag is reduced through global reset of the photodiode array and fixed pattern noise is eliminated through comparison of the photosignal level and the reset level of the floating drain. In a second mode of operation, simultaneous integration and readout processes are achieved through cessation of spill charges over the transfer gate. In a third mode of operation, regulation of the reset photodiode and transfer gate enables voltage gain between the photodiode and the sense node.

20 Claims, 8 Drawing Sheets

U.S. PATENT DOCUMENTS

| | | |
|---|---|---|
| 5,952,645 A | 9/1999 | Wang et al. |
| 5,990,506 A | 11/1999 | Fossum et al. |
| 5,995,163 A | 11/1999 | Fossum |
| 6,005,619 A | 12/1999 | Fossum |
| 6,008,486 A | 12/1999 | Stam et al. |
| 6,021,172 A | 2/2000 | Fossum et al. |
| 6,057,539 A | 5/2000 | Zhou et al. |
| 6,137,100 A * | 10/2000 | Fossum et al. .......... 250/208.1 |
| 6,166,768 A * | 12/2000 | Fossum et al. ............. 348/308 |
| 6,201,270 B1 * | 3/2001 | Chen .......................... 257/292 |
| 6,307,195 B1 * | 10/2001 | Guidash .................. 250/208.1 |
| 6,667,768 B1 * | 12/2003 | Fossum ...................... 348/308 |
| 6,847,070 B1 * | 1/2005 | Fox ........................... 257/291 |
| 6,888,122 B1 * | 5/2005 | Fossum .................. 250/208.1 |

* cited by examiner

MODE 1

Flood PD (global)

Spill PD/FD (global)

Start integration

Integration complete

Shutter closed
Start reading rows
Read row n FD

Flood PD (row n)

Spill PD/FD (row n)

Move on to row n+1

Integrate signal on PD

Transfer to FD

Read value

Flood FD (row n)

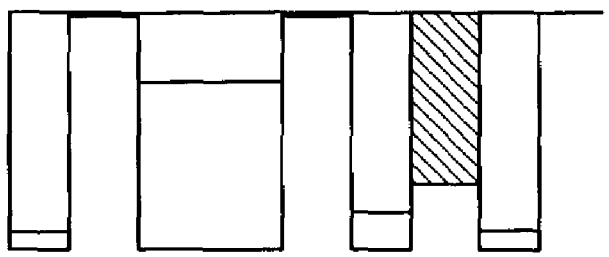
FIG. 4E  Spill FD (row n)
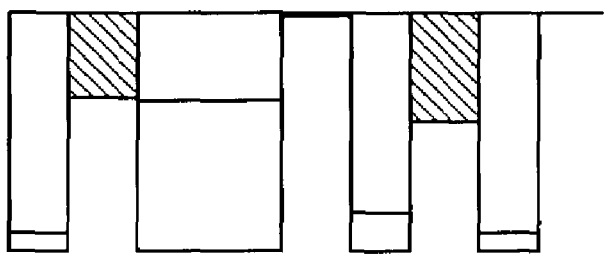
FIG. 4F  Shutter closed
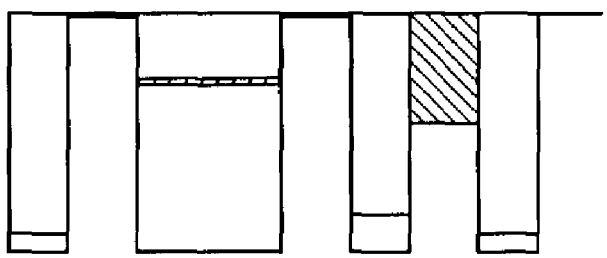
FIG. 4G  Integrate signal on PD Integrate signal on PD/FD Read signal level Reset Read Reset level

PHOTODIODE-TYPE PIXEL FOR GLOBAL ELECTRONIC SHUTTER AND REDUCED LAG

CROSS-REFERENCE TO RELATED APPLICATIONS

This application is a continuation of and claims priority to U.S. application Ser. No. 09/025,079, filed Feb. 17, 1998, now U.S. Pat No. 6,667,768.

TECHNICAL FIELD

This disclosure relates to active image capturing using photodiodes. More particularly, the present disclosure describes to active pixel devices using photodiodes as their active elements.

BACKGROUND

Active pixel devices include a light sensing element, and internal image processing structure. Many active pixel sensors, such as that described in U.S. Pat. No. 5,471,515, the disclosure of which is incorporated by reference herein, have a buffer structure, e.g., a source follower, as part of each pixel.

Active pixel sensors can use photodiodes or photogates, or other light sensitive elements. In many photodiode type active pixels, the light sensitive element is directly connected to the active pixel amplifier and/or buffer.

A global shutter effect commands all the pixels to integrate for the same short absolute period of time. This effectively freezes the motion of objects. However, in a photodiode device, an external light blocking shutter has typically been used to stop the photodiode from accumulating photosignal.

FIG. 1 shows one approach. A sampling switch 102 and capacitor 104 are used. Sampling switch 102 is placed between the photodiode 100 and the capacitor 104. The capacitor charge node 106 is connected to the active pixel amplifier 110. The photodiode voltage is sampled by a closing switch 102 and allowing the charge from the photodiode to charge sampling capacitor 104. Switch 102 and capacitor 104 are covered by a metallic light shield to avoid pickup of undesirable light signal. This allows freezing the charge output at any given time.

However, the charge from the photodiode 100 is shared onto the capacitor 104 in the voltage domain. When the switch 102 is closed, the charge flows from the photodiode 102 in order to equalize the voltage between photodiode output and capacitor 106 node. Thus, the maximum signal-induced voltage swing of the capacitor 104 may be limited by the voltage of the photodiode. Since charge is shared, the voltage swing is in fact, always lower. Furthermore, turning off the sampling switch may itself inject charge to the sampling capacitor. This, in turn, adds offset and noise.

SUMMARY

The present disclosure describes an approach to this drawback described above. This is done by enabling voltage gain between the photodiode 100 and its sensing node.

The embodiment reduces lag in a photodiode-type active pixel for a global electronic shutter. More particularly, the invention operates in three modes to achieve improved image quality and photodiode performance.

In the first mode of operation, an image is captured by a photodiode array. Lag is reduced when the photodiodes are globally reset by a flood and spill of charge cycle. A readout phase follows the reset phase. During this second phase, image quality is improved by the elimination of fixed pattern noise through the comparison of the photosignal level and the reset level of the floating drain.

In the second mode of operation, global shutter simultaneous integration and readout processes are achieved by cessation of charges which trickle out over the transfer gate as in the first mode.

In the third mode of operation, lower conversion gain of a combined photodiode is achieved by restoring the sensor to normal operation through regulation of the reset photodiode and the transfer gate.

The details of one or more embodiments of the invention are set forth in the accompanying drawings and the description below. Once the details of the invention are known, numerous additional innovations and changes will become obvious to one skilled in the art.

DESCRIPTION OF DRAWINGS

FIGS. 4A–4G are diagrams of a photosignal integration and readout phase operation for simultaneous integration and readout processes in accordance with the invention.

Like reference numbers and designations in the various drawings indicate like elements.

DETAILED DESCRIPTION

Figure 2A:
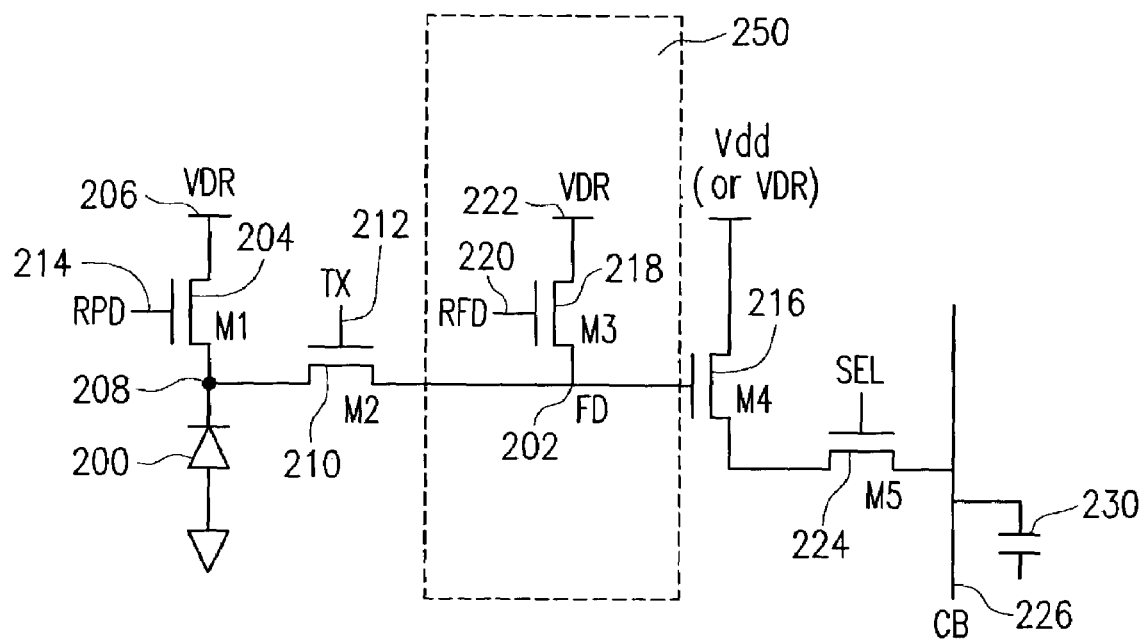
FIG. 2A is a diagram of a photodiode-type active pixel in accordance with the invention.
Figure 2B:
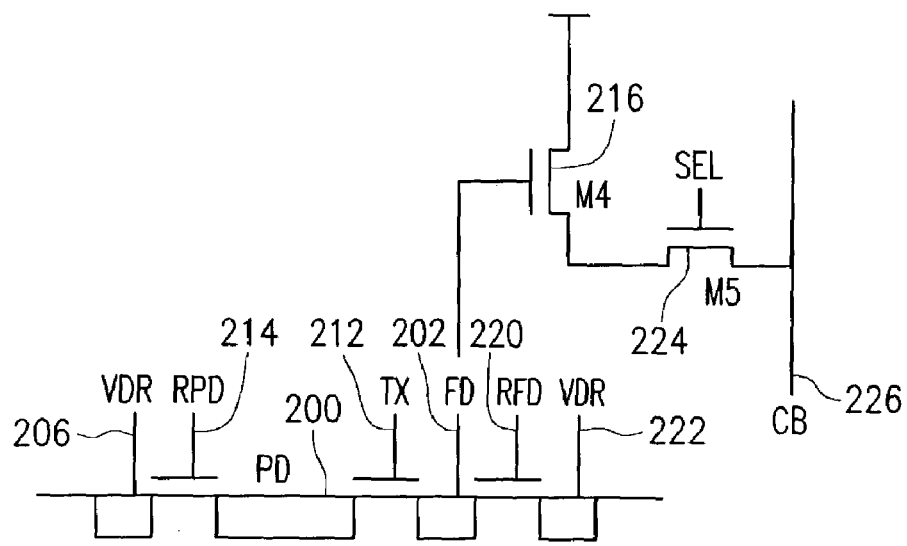
FIG. 2B is a detailed diagram of the photodiode-type active pixel in accordance with the invention.

An embodiment is shown in FIGS. 2A and 2B. This embodiment minimizes the problem of charge injection, and also reduces lag.

FIG. 2A shows a schematic view of the preferred circuit. Photodiode 200 is connected to the source of FET 204 whose drain is connected to a bias voltage level VDR 206. FET 204 is used to reset the photodiode. Signal RPD 214 controls reset of the photodiode.

FET 210 also connects the photodiode output node 208 to a floating diffusion ("FD") node 202. FD has a capacitance of approximately 0.016 pf (or 10 µV/e–). FET 210 is driven by a signal applied to transfer gate TX 212. Preferably, the FET is dc-biased in a 5 volt n-well implementation at about 1 volt.

FD 202 is connected to the gate of source-follower FET 216 which acts as a buffer and amplifier. The output is gated by selector transistor 224, and selectively driven to column bus 226.

The voltage on FD 202 is also reset under control of FET 218. FET 218 is driven by reset floating diffusion control voltage RFD 220. The reset transistor 218 resets the node to the level of voltage VDR 222.

FIG. 2B shows the same circuit in transistor well form. While FIG. 2A shows these devices as transistors, FIG. 2B shows them more accurately as gates and wells.

The operation of the image sensor in a first mode of operation is explained with reference to FIGS. 3A–3H, and the flowchart of FIG. 3I. This sensor operates in two phases—an image acquisition phase, and an image readout phase. This preferred mode of the sensor separates read out from integration in order to allow a simultaneously integrating electronic shutter and the dual sampling for fixed pattern noise reduction.

Figure 3A:
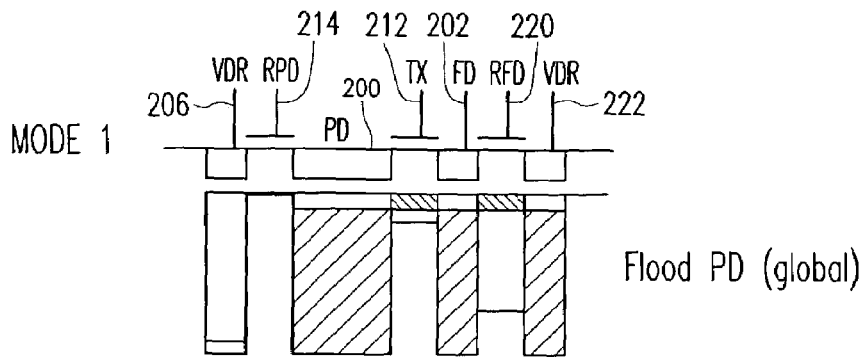
FIGS. 3A–3H are diagrams of a photosignal integration and readout phase operation in accordance with the invention.

The inventors recognized that lag is caused by an initial value in the photodiode at a beginning of integration. This embodiment starts with a global reset of the photodiodes at 300 and in the state shown in FIG. 3A. All photodiodes in the entire array are operated simultaneously. Voltage drain VDR 222 is initially set to 5 volts and RPD 214 is off. RFD 220 is turned on and VDR 206 is set to ground. This floods photodiode 200 and FD 202 with charge, as shown in FIG. 3A.

Figure 3B:
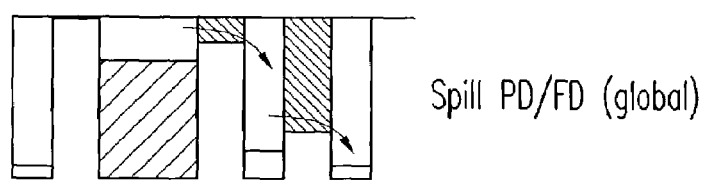

After approximately 1 µs, VDR 222 is returned to 5 volts as shown in FIG. 3B. This causes the flooded PD 200 to spill out over transfer gate TX 212 to the level set by the bias on 212. It also causes the charge on FD to spill over transistor 218's RFD barrier to VDR 222. This spill cycle also lasts approximately 1 µs.

The flood and spill ensures that the initial conditions on PD 200 will be the same for all frames and that its initial state is erased. Since all initial conditions are the same, artifacts, and hence lag, is eliminated or reduced.

Figure 3C:
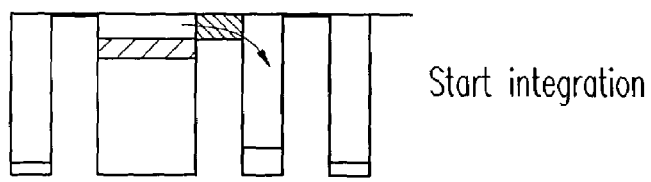
Figure 3D:
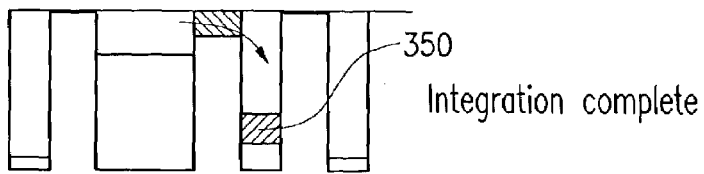
Figure 3E:
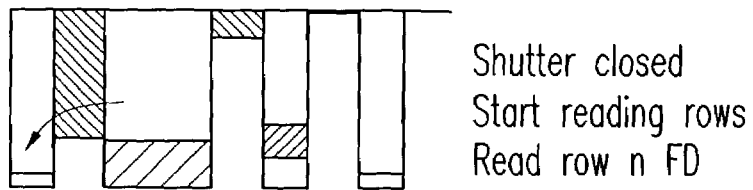
Figure 3F:
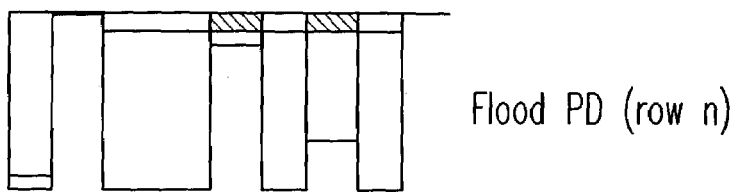
Figure 3G:
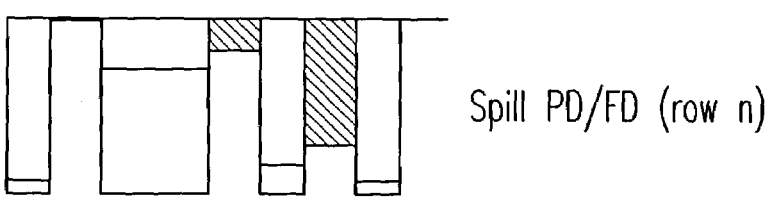
Figure 3H:
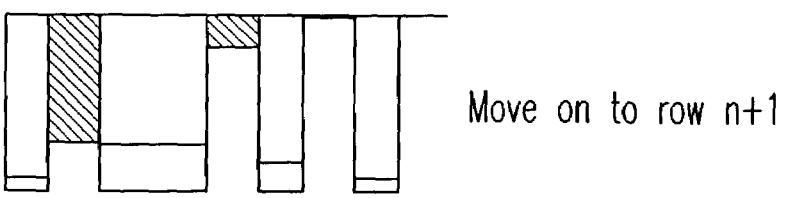
Figure 3I:
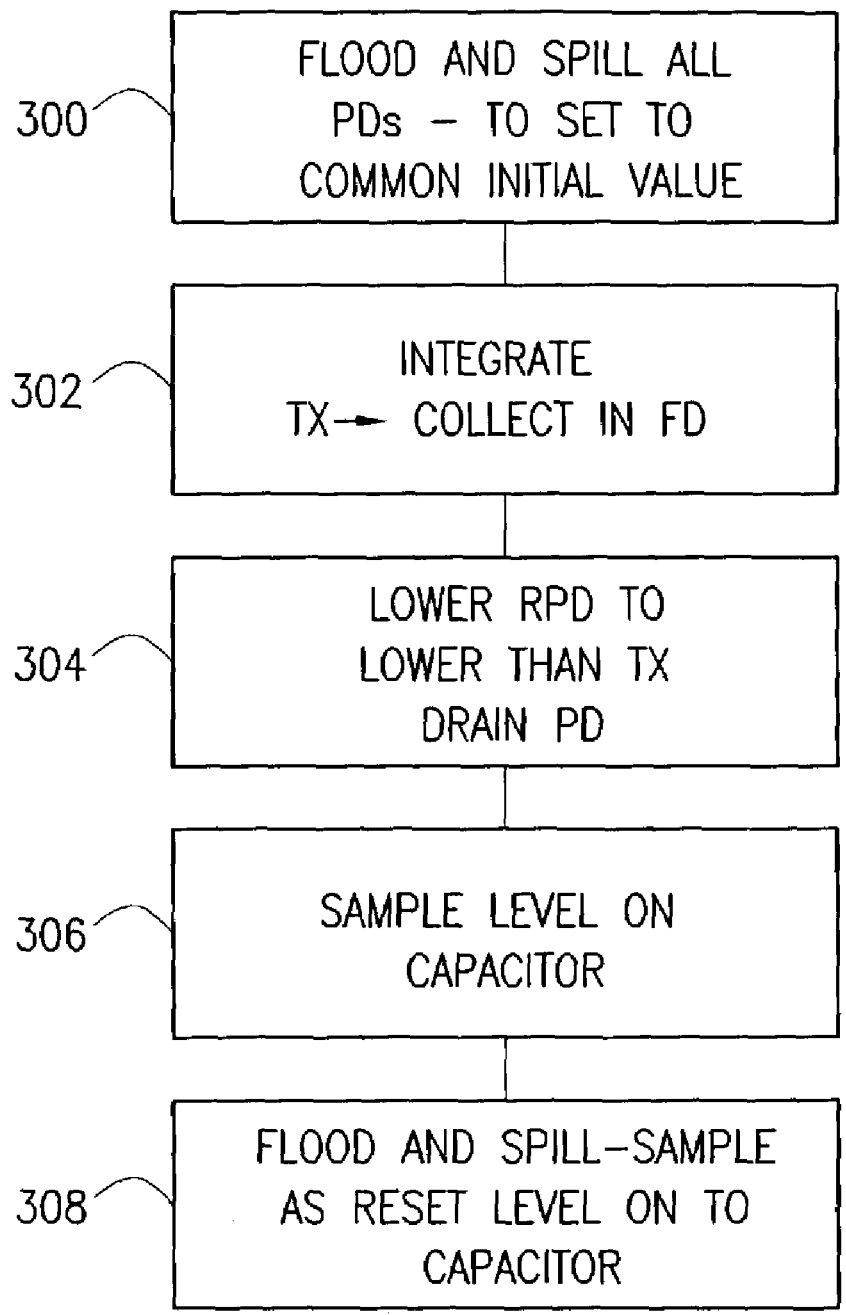
FIG. 3I is a diagram in flow chart form showing operation of a photodiode type active pixel according to one aspect of the invention.

After the reset, PD 200 integrate the photosignal for the desired integration period, as step 302 in FIG. 3I, and as shown in FIG. 3C. The initial flood and spill has left the PD charged to the level of the TX barrier. Hence, as the photosignal is collected, it trickles over TX 212 barrier and is collected by FD 202 as collected charge 350.

The change in voltage on node FD 202 is determined by its capacitance and is estimated above to be 10 µV/e–.

The integration period is ended by setting RPD 214 to 5 volts, as shown in FIG. 3E. This effectively closes the shutter by draining all additional photoelectrons from PD down to the level of the RPD, over the transistor 210 barrier to the drain level CDR 206. The barrier RPD is kept lower than TX 212 to ensure that the photoelectrons are drained way and not into the FD, as shown in step 304. Hence, the photosignal is held on FD 202. FD 202 is covered by a light shield 250 and protected from unwanted light signal. The output of the floating diffusion drives the high impedance input of a source follower transistor 216. The signal is hence stored as long as RPD 214 remains on. This continues until after the pixel is selected for readout.

In the readout phase, pixels are selected a row at a time by the select transistor 224. When enabled, the voltage on the output of the source follower transistor 216 is driven onto the column output bus CB 226. When the row is first selected, the voltage is sampled onto capacitor 230 at 306. This represents the photosignal level (VS). Photodiode 200 and output node FD 202 is then reset by another flood and spill sequence as above, and shown in 3F and 3G. The cycle is timed identically to the global reset described above. At the completion of the cycle, RFD 220 is set low and FD 202 is sampled. This represents the reset level (VR) of the floating drain FDR. That voltage is sampled on to capacitor 230 to form a difference between VS and VR which is proportional to the integrated light signal during the integration period. By taking the difference, fixed pattern noise introduced by transistor threshold non-uniformities and possibly timing skew across rows is minimized, thereby improving image quality. After subsequent processing (e.g., analog and digital conversion and readout), the next row is selected for readout, as shown in FIG. 3H.

FIG. 3I is a flow diagram showing operation of an embodiment of the invention according to the above-described process. The illustrated process steps include "Flood and spill all photodiodes to set to a common initial value" 300, "Integrate, TX and collect in FD" 302, "Lower RPD to lower than TX drain PD" 304, "Sample level on capacitor" 306 and "Flood and spill—sample as reset level on to capacitor" 308.

This process repeats until all rows desired for readout have been read out. The sensor then returns to its integrate mode.

Because charge is transferred in a trickle mode between the PD 200 and FD 202, operations affecting either node during integration and prior to readout may adversely affect the accuracy.

Figure 4A:
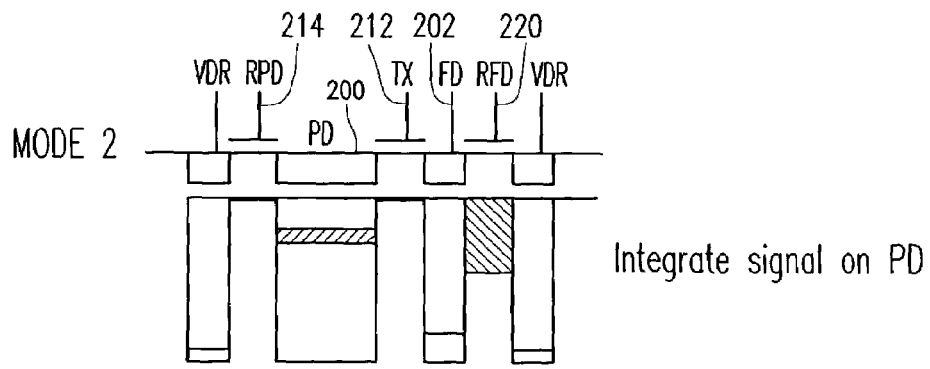
Figure 4B:
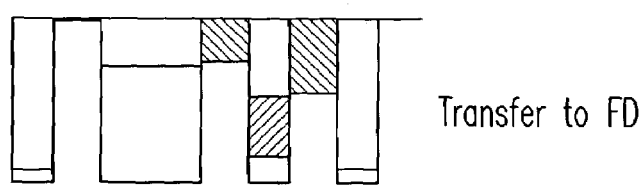
Figure 4C:
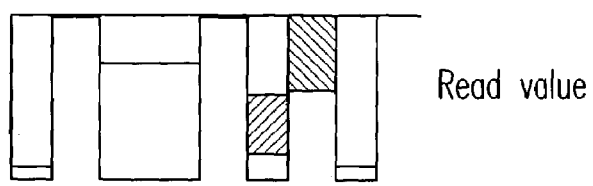
Figure 4D:
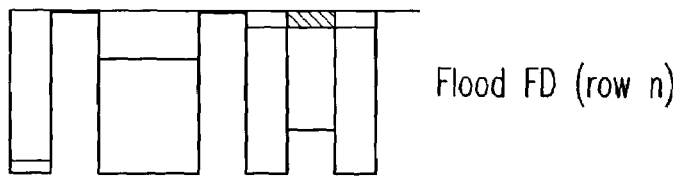

An alternative mode 2 is illustrated in FIGS. 4A–4E. In mode 2, charge is not continuously trickled over the TX 212 barrier. After the flood and spill cycle of FIGS. 3A and 3B, TX 212 is set low (to ground) as shown in FIG. 4A. This causes the photodiode to integrate the incoming charge. Charge can then be transferred to FD 202 all at once, at a desired time. TX 212 is returned to its initial spill value. This transfers the excess charge obtained since the spill of FIG. 3b from PD 200 to FD 202. FD 202 can then be read out as shown in FIG. 4C. The reset level of FD is estimated by performing the flood and spill operation with TX 212 set low, as shown, respectively, in FIGS. 4D and 4E. This allows simultaneous integration and readout processes.

FIGS. 4F and 4G show how the shutter can be closed by enabling RPD to allow incoming charge to spill over the barrier.

This mode does not describe PD 200 being flooded between frames. RPD 214 can still be used to control the integration duty cycle, with transfer to FD 202 only during the inter-frame blanking interval. However, since the threshold voltages of RPD 214 and RFD 220 may not be equal, some offset nonuniformity can be expected. If RPD 214 is a little deeper than RFD 220 for the same applied gate voltage, PD 200 will have a "pocket" that will result in reduced signal for low light levels.

Operation of the image sensor in mode 3 is illustrated in FIG. 5. This is a diagram of a photosignal integration and readout phase for a combined photodiode with lower conversion gain in accordance with the invention.

Figure 5A:
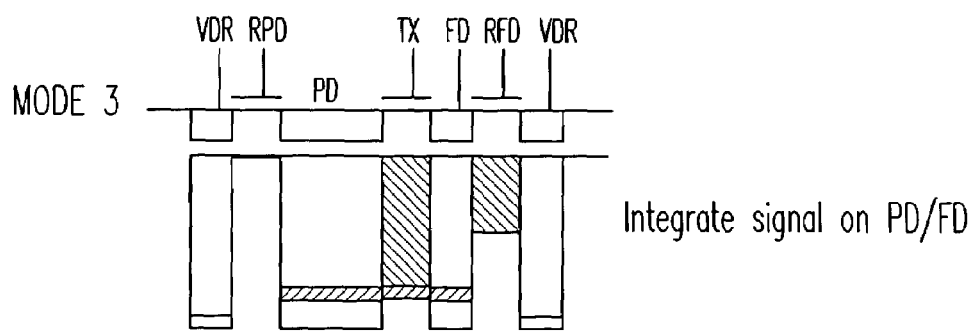
FIG. 5 is a diagram of a photosignal integration and readout phase operation for a combined photodiode with lower conversion gain in accordance with the invention.
Figure 5B:
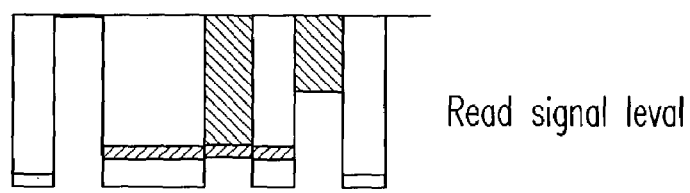
Figure 5C:
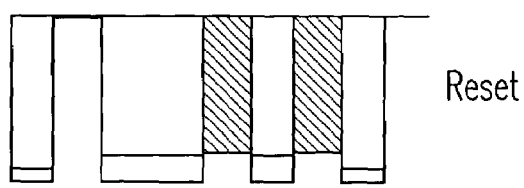
Figure 5D:
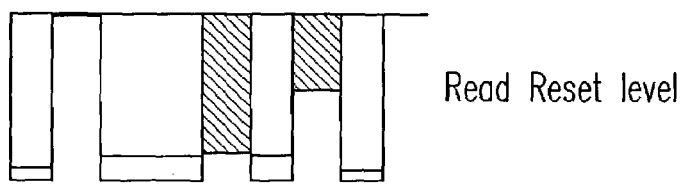
Figure 1:
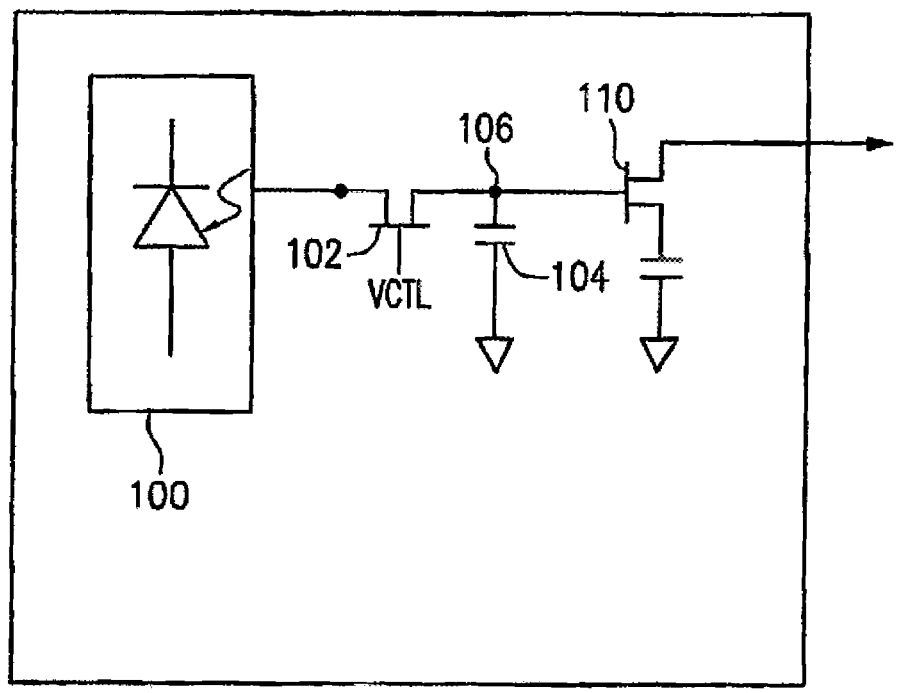

The sensor can be restored to "normal" photodiode APS operation by keeping RPD 214 off. TX 212 is biased at Vdd. This creates a combined photodiode of PD 200 and FD 202. FIG. 5A shows integrating the incoming signal on the combined PD/FD. The signal is read by sampling the source follower 216 in FIG. 5B. The PD/FD combination is then reset in FIG. 5C by turning on RFD and hence draining the PD/FD combination. At FIG. 5D, that reset level is read for correction of the reset level.

Other embodiments are contemplated. For example, different switching elements could be used. Different channel conductivities allows the biasing to be done differently. All such modifications are intended to be encompassed within the following claims.

What is claimed is:

1. An active pixel sensor, comprising: a photodiode part located at least partially in a substrate and constructed to accumulate a signal indicative of incoming light during an integration period; a floating diffusion part located at a first side of said photodiode part, selectively connected to receive said signal from said photodiode part; a transfer barrier gate, having a bias level which allows said signal to pass from said photodiode part to said floating diffusion part; a buffer, connected to sample a signal on said floating diffusion part; a storage region located at a second side of said photodiode part in said substrate for receiving excess charge from said photodiode part at an end of said integration period; and at least one flood and spill control part, connected to at least said photodiode part and controlling flooding of at least said photodiode part to provide a known initial condition on said photodiode part.

2. The sensor as in claim 1, further comprising a shutter gate, connected on a source side to said photodiode part, and having a shuttered bias level which is lower than said bias level on said transfer barrier gate, and which forces all charge in said photodiode part to be drained into said storage region on a drain side of said shutter gate.

3. The sensor of claim 2, wherein said flood and spill control part controls flood and spill to both said photodiode part and said floating diffusion part.

4. The sensor of claim 1, wherein said bias level on said transfer barrier is a level that allows incoming charge on said photodiode part to trickle into said floating diffusion part during said integration period.

5. The sensor of claim 1, wherein said bias level on said transfer barrier is varied between a first level that accumulates charge in said photodiode part, and a second level that passes charge in said photodiode part to said floating diffusion part.

6. The sensor of claim 1, further comprising a double sampling element, receiving a first value indicative of a total charge, and a second value indicative of a reset level.

7. The sensor of claim 6, wherein said first value comprises a photosignal level, and said second value comprises a level after said flooding and spilling.

8. A method of operating an active pixel sensor comprising: flooding at least one photosensitive part which at least includes a photodiode with excess charge; allowing said at least one part to spill to a first drain region on a first side of said photodiode so that said photodiode has a predetermined level of charge to begin an integration period; accumulating photoconductors in the photodiode; transferring said photoconductors to a floating diffusion region; draining excess charge into a second drain region at a second side of said photodiode; and sampling at least two levels from the floating diffusion representing sample and reset levels, to determine an amount of light incident on the photodiode.

9. A method as in claim 8, wherein the act of draining excess charge to a second drain region comprises operating a gate which has a lower potential than a potential applied to a gate utilized during said transferring.

10. A method as in claim 8, wherein said transferring comprises biasing a gate at a level that allows incoming charge on the photodiode to trickle into the floating diffusion region.

11. The method of claim 8, wherein said transferring comprises applying a pulse to a gate at a level that allows charge on the photodiode to transfer all at once into the floating diffusion region.

12. The method of claim 8, wherein the active pixel sensor comprises a plurality of pixels, each pixel having a photosensitive part which includes a photodiode, and wherein the method comprises spilling the charge at the photosensitive parts so that each part has a predetermined level of charge to begin said integration period.

13. The method of claim 12, wherein each pixel has a common integration period.

14. The method of claim 13, wherein the common integration periods are ended by the act of draining excess charge into respective second drain regions for each pixel.

15. An active pixel sensor, having a plurality of pixels each comprising:
a photodiode, constructed in a substrate to receive incoming light and generate charge;
first and second charge storage regions located in the substrate at respective first and second sides of said photodiode;
a reset transistor for setting a charge level at said photodiode and said first charge storage region to a predetermined level;
a first transfer transistor gate located between the photodiode and the first charge storage region and adapted to receive a first bias level for allowing charge to transfer from said photodiode to said first charge storage region;
and a second transfer transistor gate located between the photodiode and the second charge storage region and adapted to receive a second bias level for allowing charge to transfer from said photodiode to said second charge storage region, wherein the second bias creates a lower potential barrier between the photodiode and the second charge storage region than exists between the photodiode and the first charge storage region.

16. The active pixel sensor of claim 15, further comprising a controller constructed to simultaneously apply said second bias level to every second transfer transistor gate in said sensor.

17. A method of operating an active pixel device, comprising:
causing a plurality of photodiode regions to reach an initial predetermined level of charge by:
applying light to said photodiode regions to generate charge; and
lowering a potential barrier to a first level between said photodiode regions and respective first drain regions to cause a predetermined amount of charge to drain into the first drain regions;
integrating charge at the photodiode regions during an integration period;
transferring charge from the photodiode regions to respective floating diffusion regions;
ending said integration period by lowering a second potential barrier, to a level less than said first level, between said photodiode regions and respective second drain regions; and
reading out a plurality of signals representing amounts of charge transferred respectively to said floating diffusion regions.

18. The method of claim 17, wherein the act of ending said integration period by creating a second potential barrier comprises applying a voltage to a plurality of gates, each gate connected at a source side to one of said photodiode regions, and connected at a drain side to one of said second respective drain regions.

19. The method of claim 17, further comprising the act of reading out a plurality of signals representing a respective reset condition for each of the floating diffusion regions.

20. The method of claim 17, wherein the integration periods are the same for each of the photodiode regions.

* * * * *

UNITED STATES PATENT AND TRADEMARK OFFICE
CERTIFICATE OF CORRECTION

| | | |
|---|---|---|
| PATENT NO. | : 7,095,440 B2 | Page 1 of 2 |
| APPLICATION NO. | : 10/273085 | |
| DATED | : August 22, 2006 | |
| INVENTOR(S) | : Eric R. Fossum | |

Figure 1:
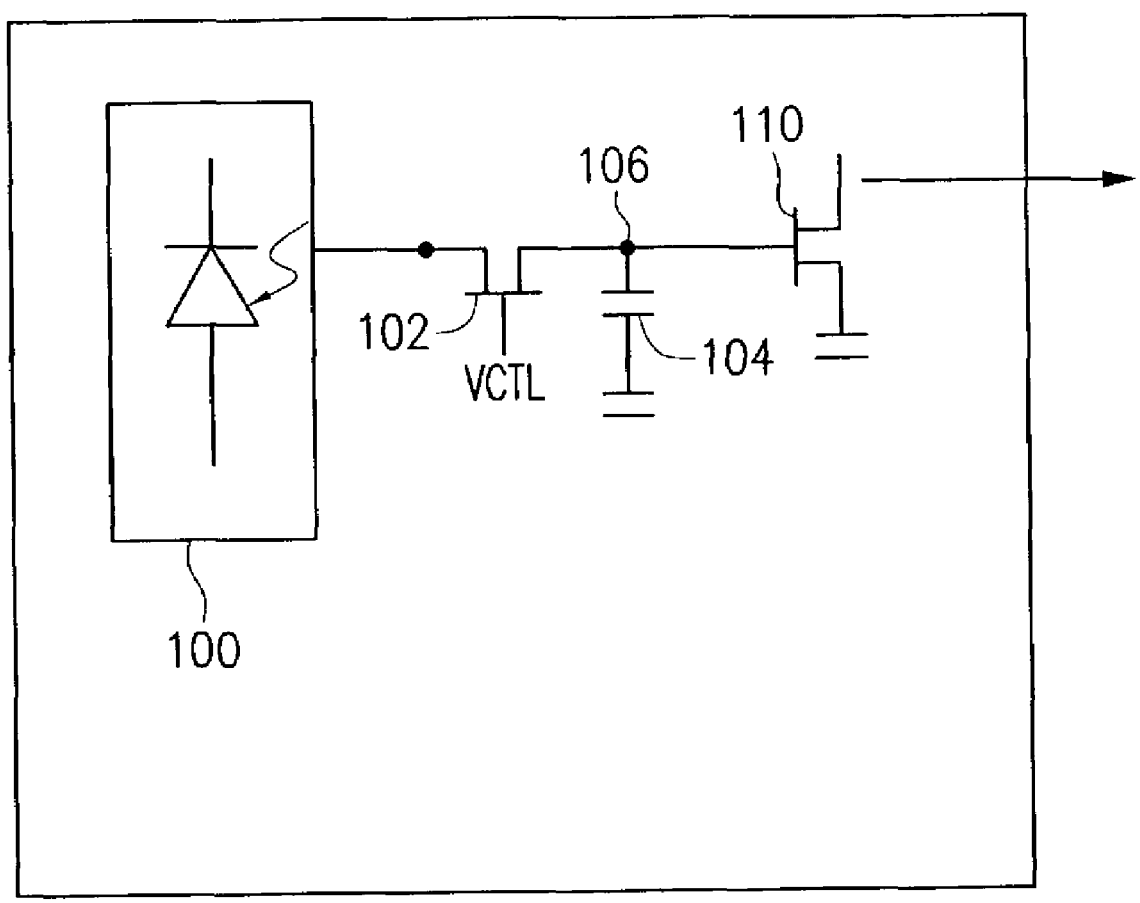
FIG. 1 is a diagram of an embodiment of a photodiode type active pixel.

It is certified that error appears in the above-identified patent and that said Letters Patent is hereby corrected as shown below:

In the Drawings:

Fig. 1 in the patent is replaced with the attached Replacement Drawing Sheet

In the Specification, the following errors are corrected:

Column 2, line 36. "FIG. 4A-4G" should read --FIGS. 4A-4G--; and

Column 2, line 39, "FIG. 5" should read --FIGS. 5A-5D--.

Signed and Sealed this

Twenty-ninth Day of May, 2007

JON W. DUDAS
*Director of the United States Patent and Trademark Office*